United States Patent
Edelstein et al.

(10) Patent No.: US 10,249,702 B2
(45) Date of Patent: Apr. 2, 2019

(54) METAL RESISTORS HAVING VARYING RESISTIVITY

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/914,106

(22) Filed: Mar. 7, 2018

(65) Prior Publication Data

US 2018/0197941 A1    Jul. 12, 2018

Related U.S. Application Data

(62) Division of application No. 15/132,758, filed on Apr. 19, 2016, now Pat. No. 9,972,671.

(51) Int. Cl.
*H01L 49/02* (2006.01)
*H01L 21/02* (2006.01)
(Continued)

(52) U.S. Cl.
CPC .......... *H01L 28/24* (2013.01); *H01L 21/0234* (2013.01); *H01L 21/02332* (2013.01);
(Continued)

(58) Field of Classification Search
CPC ....................................................... H01L 28/24
See application file for complete search history.

(56) References Cited

U.S. PATENT DOCUMENTS

| 4,760,369 A | 7/1988 | Tiku |
| 6,207,560 B1 | 3/2001 | Lee |

(Continued)

FOREIGN PATENT DOCUMENTS

CN    104361967 A    2/2015

OTHER PUBLICATIONS

Scandurra, A., et al., "Tantalum nitride thin film resistors by low temperature reactive sputtering for plastic electronics" Surface and Interface Analysis, Mar.-Apr. 2008, pp. 758-762, vol. 40, Issue 3-4.

(Continued)

*Primary Examiner* — Daniel Luke
(74) *Attorney, Agent, or Firm* — Scully, Scott, Murphy & Presser, P.C.; Steven J. Meyers (57) ABSTRACT

A semiconductor structure is provided that includes a first metal resistor structure located on a portion of a dielectric-containing substrate. The first metal resistor structure includes, from bottom to top, a first nitridized dielectric surface layer portion having a first nitrogen content, a first metal portion, and a first dielectric capping layer portion. The semiconductor structure of the present application further includes a second metal resistor structure located on a second portion of the dielectric-containing substrate and spaced apart from the first metal resistor structure. The second metal resistor structure includes, from bottom to top, a second nitridized dielectric surface layer portion having a second nitrogen content that differs from the first nitrogen content, a second metal portion, and a second dielectric capping layer portion.

20 Claims, 6 Drawing Sheets

(51) Int. Cl.
*H01L 23/522* (2006.01)
*H01L 27/01* (2006.01)
*H01L 21/62* (2006.01)

(52) U.S. Cl.
CPC ........ *H01L 21/02337* (2013.01); *H01L 21/62* (2013.01); *H01L 23/5228* (2013.01); *H01L 27/016* (2013.01)

(56) References Cited

U.S. PATENT DOCUMENTS

| | | |
|---|---|---|
| 6,232,042 B1 | 5/2001 | Dunn et al. |
| 6,495,477 B2 | 12/2002 | Taylor et al. |
| 8,013,394 B2 | 9/2011 | Chinthakindi et al. |
| 8,288,826 B2 | 10/2012 | Chou et al. |
| 8,400,257 B2 | 3/2013 | Lim et al. |
| 8,420,531 B2 | 4/2013 | Yang et al. |
| 8,426,745 B2 | 4/2013 | Gaul et al. |
| 8,873,276 B2 | 10/2014 | Kumar et al. |
| 9,243,321 B2 | 1/2016 | Tendulkar |
| 2003/0178396 A1 | 9/2003 | Naumov |
| 2004/0027234 A1 | 2/2004 | Hashimoto et al. |
| 2006/0290462 A1 | 12/2006 | Beach |
| 2007/0013009 A1 | 1/2007 | Wu et al. |
| 2008/0213927 A1 | 9/2008 | Wang et al. |
| 2012/0313220 A1 | 12/2012 | Yang |
| 2014/0008764 A1 | 1/2014 | Yang et al. |
| 2014/0291602 A1 | 10/2014 | Kenyon et al. |
| 2015/0188046 A1 | 7/2015 | Wang |

OTHER PUBLICATIONS

Wilks, J. A., et al. "Nitridation of organo-silicate glass: A self-limiting process for PVD Ta1+xN/Ta barrier formation", Applied Surface Science, Aug. 2009, pp. 9543-9547, 255(23).

List of IBM Patents or Patent Applications Treated as Related dated Mar. 7, 2018, 2 pages.

METAL RESISTORS HAVING VARYING RESISTIVITY

BACKGROUND

The present application relates to a semiconductor structure and a method of forming the same. More particularly, the present application relates to a semiconductor structure containing at least a first metal resistor structure having a first resistivity and a second metal resistor structure having a second resistivity that differs from the first resistivity, and a method of forming such a semiconductor structure.

A resistor is one of the most common electrical components, and is used in almost every electrical device. In semiconductor device fabrication, it is well known to have thin film resistors embedded in the back-end-of-line (BEOL) structures of the chip through either a damascene approach or a subtractive etch method. BEOL thin film resistors are generally preferred over other types of resistors because of the lower parasitic capacitance. Conventional resistor materials and fabrication methods, however, present a number of challenges.

In one approach, the sheet resistivity of various resistors formed over an entire wafer may vary and go beyond specifications due to poor process control. In an advanced manufacturing line, wafers out of specification are often scrapped for quality control, which is expensive.

One material used for resistors is doped polysilicon. A problem with this conventional resistor material is that it can only provide a limited resistance within a limited dimension, which presents problems as further miniaturization of the device features continues. Resistive thin films such as chromium silicide (CrSi) and tantalum nitride (TaN) are also used as resistors in semiconductor devices. Prior art metal nitride resistors such as TaN are generally formed by physical vapor deposition and as such the nitrogen content within such resistors is less than 50 atomic percent. Manufacturing metal nitride resistors having a nitrogen content that is greater than 50 atomic percent, %, nitrogen is not possible using prior art deposition techniques due to nitrogen poison related problems which are inherently present in such deposition processes.

SUMMARY

In one aspect of the present application, a semiconductor structure containing at least two metal resistor structures having different resistivities (and hence different resistance) is provided. In one embodiment of the present application, the semiconductor structure may include a first metal resistor structure located on a portion of a dielectric-containing substrate. The first metal resistor structure includes, from bottom to top, a first nitridized dielectric surface layer portion having a first nitrogen content, a first metal portion, and a first dielectric capping layer portion. The semiconductor structure of the present application further includes a second metal resistor structure located on a second portion of the dielectric-containing substrate and spaced apart from the first metal resistor structure. The second metal resistor structure includes, from bottom to top, a second nitridized dielectric surface layer portion having a second nitrogen content that differs from the first nitrogen content, a second metal portion, and a second dielectric capping layer portion.

In another aspect of the present application, a method of forming a semiconductor structure containing at least two metal resistor structures having different resistivities (and hence different resistance) is provided. In one embodiment of the present application, the method may include providing a dielectric-containing substrate including at least an interconnect dielectric material layer. A first nitridation process is performed to provide a first nitridized dielectric surface layer having a first nitrogen content in a first region of the dielectric-containing substrate and within a portion of the interconnect dielectric material layer. A second nitridation process is then performed to provide a second nitridized dielectric surface layer having a second nitrogen content that differs from the first nitrogen content in a second region of the dielectric-containing substrate and within another portion of the interconnect dielectric material layer. Next, a metal layer is formed on both the first nitridized dielectric surface layer and the second nitridized dielectric surface layer, and thereafter a dielectric capping layer is formed on the metal layer. The dielectric capping layer, the metal layer, the first nitridized dielectric surface layer and the second nitridized dielectric surface layer are then patterned to provide a first metal resistor structure spaced apart from a second metal resistor structure.

In accordance with the present application, the first metal resistor structure includes, from bottom to top, a remaining portion of the first nitridized dielectric surface layer, a first remaining portion of the metal layer, and a first remaining portion of the dielectric capping layer, and the second metal resistor structure includes, from bottom to top, a remaining portion of the second nitridized dielectric surface layer, a second remaining portion of the metal layer, and a second remaining portion of the dielectric capping layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
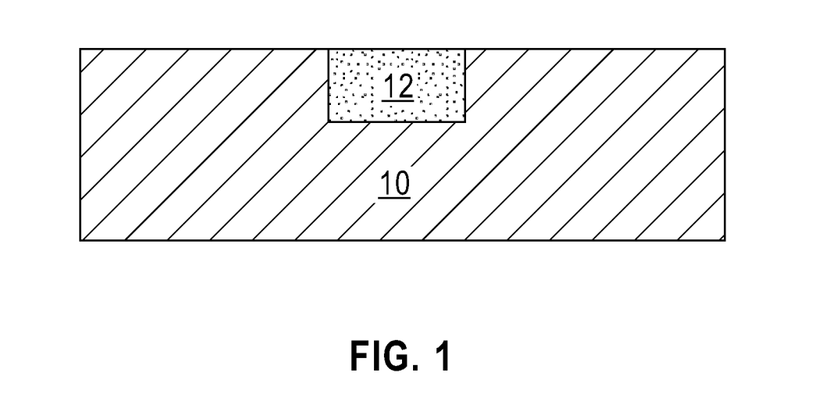
FIG. 1 is a cross sectional view of an exemplary semiconductor structure including at least one conductive region embedded in a base interconnect dielectric material layer that can be employed in accordance with an embodiment of the present application.

Referring first to FIG. 1, there is illustrated an exemplary semiconductor structure including at least one conductive region (i.e., feature or pad) 12 embedded in a base interconnect dielectric material layer 10 that can be employed in accordance with an embodiment of the present application. By "embedded" it is meant that are least a portion of each conductive region 12 is contained between a topmost surface and a bottommost surface of the base interconnect dielectric material layer 10. In some embodiments, and as shown, the topmost surface of each conductive region 12 is coplanar with a topmost surface of the base interconnect dielectric material 10 and a bottommost surface of the each conductive region 12 is located between the topmost surface and the bottommost surface of the base interconnect dielectric material layer 10.

The base interconnect dielectric material layer 10 may be located upon a substrate (not shown in the drawings of the present application). The substrate, which is not shown, may be composed of a semiconducting material, an insulating material, a conductive material or any combination thereof. When the substrate is composed of a semiconducting material, any material having semiconductor properties such as, for example, Si, SiGe, SiGeC, SiC, Ge alloys, III/V compound semiconductors or II/VI compound semiconductors, may be used. In addition to these listed types of semiconducting materials, the substrate that is located beneath the base interconnect dielectric material layer 10 can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or any combination thereof including multilayers. When the substrate is a conductive material, the substrate may include, for example, polySi, an elemental metal, alloys of elemental metals, a metal silicide, a metal nitride or any combination thereof including multilayers. When the substrate is composed of a semiconducting material, one or more semiconductor devices such as, for example, complementary metal oxide semiconductor (CMOS) devices can be fabricated thereon. When the substrate is composed of a combination of an insulating material and a conductive material, the substrate may represent an underlying interconnect level of a multilayered interconnect structure.

The base interconnect dielectric material layer 10 that is employed in the present application may be composed of any interlevel or intralevel dielectric including inorganic dielectrics or organic dielectrics. In one embodiment, the base interconnect dielectric material layer 10 may be non-porous. In another embodiment, the base interconnect dielectric material layer 10 may be porous. Some examples of suitable dielectrics that can be used as the base interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The base interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the base interconnect dielectric material layer 10 may vary depending upon the type of dielectric material(s) used. In one example, the base interconnect dielectric material layer 10 may have a thickness from 50 nm to 1000 nm. Other thicknesses that are lesser than, or greater than, the aforementioned thickness range may also be employed in the present application for the thickness of the base interconnect dielectric material layer 10.

As stated above, at least one conductive region 12 is embedded in the base interconnect dielectric material layer 10. The at least one conductive region 12 can be formed by first providing at least one opening into the base interconnect dielectric material layer 10, and then filling the at least one opening with a conductive material.

The at least one opening that is formed into the base interconnect dielectric material layer 10 can be formed utilizing a patterning process. In one embodiment, the patterning process may include lithography and etching. The lithographic process includes forming a photoresist (not shown) atop the base interconnect dielectric material layer 10, exposing the photoresist to a desired pattern of radiation and developing the exposed photoresist utilizing a conventional resist developer. The photoresist may be a positivetone photoresist, a negative-tone photoresist or a hybrid-tone photoresist. In some embodiments, a hard mask such as, for example, a layer of silicon dioxide and/or silicon nitride, can be interposed between the photoresist and the base interconnect dielectric material layer 10. The etching process includes a dry etching process (such as, for example, reactive ion etching, ion beam etching, plasma etching or laser ablation), and/or a wet chemical etching process. Typically, reactive ion etching is used in providing the at least one opening into at least the base interconnect dielectric material layer 10. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying base interconnect dielectric material layer 10.

The depth of the at least one opening that is formed into the base interconnect dielectric material layer 10 (measured from the topmost surface of the base interconnect dielectric material layer 10 to the bottom wall of the at least one opening) may vary. In some embodiments, the at least one opening may extend entirely through the base interconnect dielectric material layer 10. In yet other embodiments, the at least one opening stops within the base interconnect dielectric material layer 10 itself. In yet further embodiments, different depth openings can be formed into the base interconnect dielectric material layer 10.

The at least one opening that is formed into the base interconnect dielectric material layer 10 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the at least one opening that houses the at least one conductive region 12 is shown as a line opening. When a via or line is formed, a single damascene process (including the above mentioned lithography and etching steps) can be employed. When a combined via/line is formed a dual damascene process (including at least one iteration of the above mentioned lithography and etching steps) can be employed.

Next, a diffusion barrier (not show) can be optionally formed within the at least one opening and atop the base interconnect dielectric material layer 10. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

A conductive material (which after deposition and planarization forms the at least one conductive region 12 shown in FIG. 1) is then formed within the at least one opening and atop the base interconnect dielectric material layer 10. The conductive material may be composed of polySi, SiGe, a conductive metal, an alloy comprising at least one conductive metal, a conductive metal silicide or combinations thereof. In one embodiment, the conductive material is a conductive metal such as Cu, W or Al. In another embodiment, the conductive material is Cu or a Cu alloy (such as AlCu). The conductive material may be formed by a deposition process including chemical vapor deposition (CVD), plasma enhanced chemical vapor deposition (PECVD), sputtering, chemical solution deposition or plating. In one embodiment, a bottom-up plating process is employed in forming the conductive material of the at least one conductive region 12.

Following the deposition of the conductive material, a planarization process such as, for example, chemical mechanical polishing (CMP) and/or grinding, can be used to remove all conductive material (i.e., overburden material) that is present outside the at least one opening forming the at least one conductive region 12 embedded within the base interconnect dielectric material layer 10. The planarization stops on a topmost surface of the base interconnect dielectric material layer 10 providing the coplanar structure illustrated in FIG. 1. If a diffusion barrier and an optional plating seed layer are present, the planarization process would provide a U-shaped diffusion barrier and a U-shaped plating seed layer within the at least one opening. The U-shaped diffusion barrier and the U-shaped plating seed layer would be interposed between the base interconnect dielectric material layer 10 and the at least one conductive region 12. Also, the U-shaped diffusion barrier and the U-shaped plating seed layer would each have a topmost surface that is coplanar with a topmost surface of both the base interconnect dielectric material layer 10 and the at least one conductive region 12.

Figure 2:
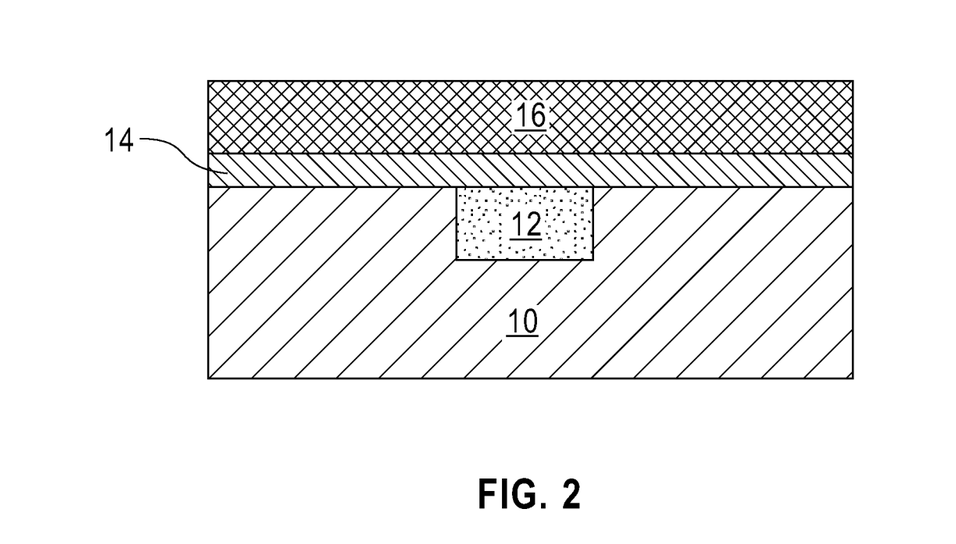
FIG. 2 is a cross sectional view of the exemplary semiconductor structure of FIG. 1 after forming a dielectric stack of, from bottom to top, a base dielectric capping layer and an interconnect dielectric material layer.

Referring now to FIG. 2, there is illustrated the exemplary semiconductor structure of FIG. 1 after forming a dielectric stack of, from bottom to top, a base dielectric capping layer 14 and an interconnect dielectric material layer 16. In some embodiments of the present application, the base dielectric capping layer 14 may be omitted such that the interconnect dielectric material layer 16 is formed directly upon the base interconnect dielectric material layer 10. Collectively, the base interconnect dielectric material layer 10, if present, the base dielectric capping layer 14, and the interconnect dielectric material layer 16 are dielectric components of a dielectric-containing substrate of the present application.

When present, the base dielectric capping layer 14 is formed on the exposed topmost surfaces of the base interconnect dielectric material layer 10 and the at least one conductive region 12. The base dielectric capping layer 14 can include any suitable dielectric capping material such as, for example, SiC, $Si_4NH_3$, $SiO_2$, a carbon doped oxide, a nitrogen and hydrogen doped silicon carbide SiC(N,H) or multilayers thereof. The base dielectric capping layer 14 can be formed utilizing a conventional deposition process such as, for example, chemical vapor deposition, plasma enhanced chemical vapor deposition, chemical solution deposition, evaporation, or atomic layer deposition. The thickness of the base dielectric capping layer 14 may vary depending on the technique used to form the same as well as the material make-up of the layer. Typically, the base dielectric capping layer 14 has a thickness from 15 nm to 100 nm. Other thicknesses that are lesser than, or greater than the aforementioned thickness range may also be employed as the thickness of the base dielectric capping layer 14.

The interconnect dielectric material layer 16 may be composed of one of the dielectric materials mentioned above for the base interconnect dielectric material layer 10; the interconnect dielectric material layer 16 can be referred to as a second interconnect dielectric material layer, while the base interconnect dielectric material layer 10 may be referred to as a first interconnect dielectric material layer.

In one embodiment, the interconnect dielectric material layer 16 is composed of a same dielectric material as the base interconnect dielectric material layer 10. In another embodiment, the interconnect dielectric material layer 16 is composed of a different dielectric material than the base interconnect dielectric material layer 10. The interconnect dielectric material layer 16 can be formed utilizing one of the deposition processes mentioned above for forming the base interconnect dielectric material layer 10, and the thickness of the interconnect dielectric material layer 16 is within the range mentioned above for the base interconnect dielectric material layer 10.

Figure 3:
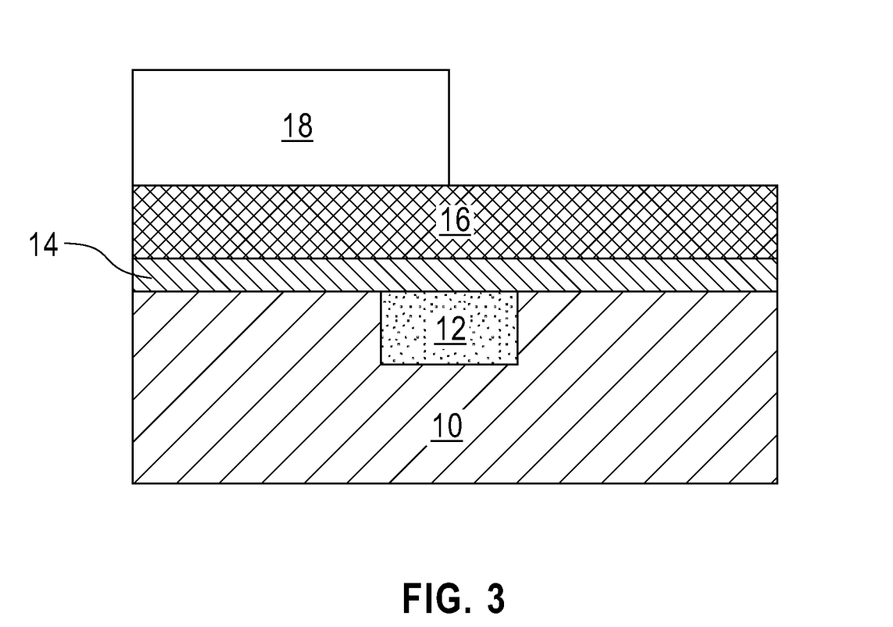
FIG. 3 is a cross sectional view of the exemplary semiconductor structure of FIG. 2 after forming a first block mask on a surface of the dielectric stack.

Referring now to FIG. 3, there is illustrated the exemplary semiconductor structure of FIG. 2 after forming a first block mask 18 on a surface of the dielectric stack (14, 16). The first block mask 18 is formed on a preselected region of the dielectric-containing substrate. Notably, the first block mask 18 is formed on a portion of the interconnect dielectric material layer 16, while leaving at least one other portion of the interconnect dielectric material layer 16 exposed and available for further processing. In the present application, a first region of the dielectric-containing substrate (10, 14, 16) is left exposed, while a second region of the dielectric-containing substrate (10, 14, 16) is protected by first block mask 18.

The first block mask 18 may be any suitable block mask material which prevents nitrogen diffusion therethrough. Examples of suitable block mask materials that can be employed in the present application include, for example, a photoresist material (as mentioned above), a dielectric hard mask material (as mentioned above), or a combination of, from bottom to top, a dielectric hard mask material and a photoresist material. The first block mask 18 can be formed by first depositing a blanket layer of a block mask material. The block mask material may be deposited by chemical vapor deposition, plasma enhanced chemical vapor deposition, physical vapor deposition, spin-on coating or any combination thereof. Following the deposition of the blanket layer of block mask material, the blanket layer of block mask material is patterned. In some embodiments, patterning of the blanket layer of block mask material may include lithography only. Such an embodiment is employed when the blanket layer of block mask material consists only of a photoresist material. In other embodiments, patterning of the blanket layer of block mask material may include lithography, followed by an etch. Such an embodiment may be employed when the blanket layer of block mask material consists of only a hard mask material or a hard mask material/photoresist material stack.

The first block mask 18 has a thickness that is sufficient to prevent nitrogen diffusion therethrough. In one embodiment of the present application, the first block mask 18 has a thickness from 25 nm to 200 nm. Other thicknesses that are lesser than, or greater than the aforementioned range can be employed so long as the thickness of the first block mask 18 is sufficient to prevent nitrogen diffusion therethrough.

Figure 4:
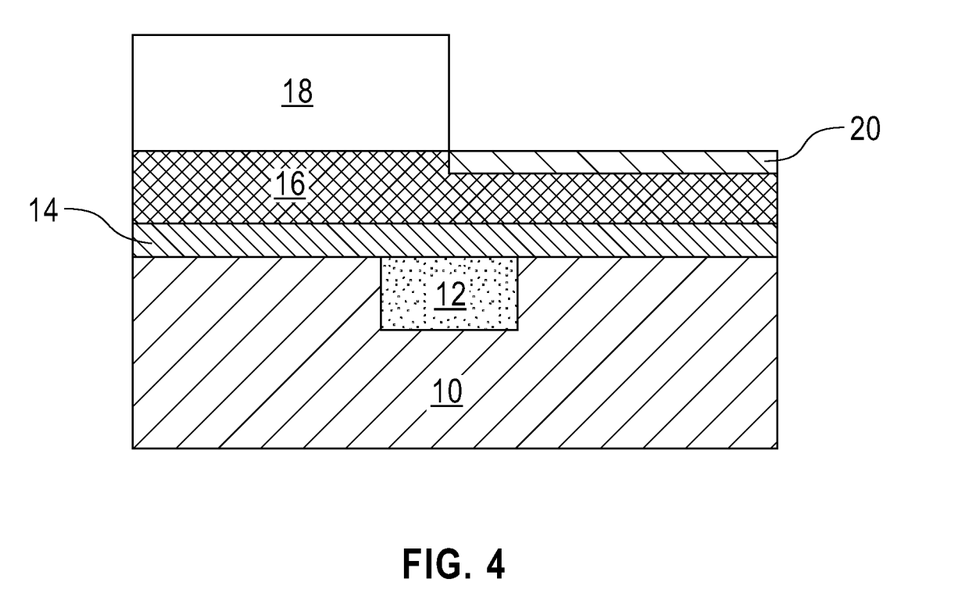
FIG. 4 is a cross sectional view of the exemplary semiconductor structure of FIG. 3 after performing a first nitridation process to provide a first nitridized dielectric surface layer having a first nitrogen content.

Referring now to FIG. 4, there is illustrated the exemplary semiconductor structure of FIG. 3 after performing a first nitridation process to provide a first nitridized dielectric surface layer 20 having a first nitrogen content; no nitridation occurs in the region of the dielectric-containing substrate that is protected by the first block mask 18. The first nitridation process may also be referred to herein as a first nitride surface treatment process. The first nitridized dielectric surface layer 20 may also be referred to herein as a first nitrogen enriched dielectric surface layer. By "nitrogen enriched dielectric surface layer" it is meant, that the exposed upper surface of the interconnect dielectric material layer 16 has a higher nitrogen content therein after performing the nitridation process as compared to the originally deposited interconnect dielectric material layer 16.

In one embodiment, the first nitridation process used in forming the first nitridized dielectric surface layer 20 is a thermal nitridation process. When a thermal nitridation process is employed, no damage to the interconnect dielectric material layer 16 is observed. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 450° C. In another embodiment, the thermal nitridation process employed in the present application is performed at a temperature from 100° C. to 300° C.

In addition to a thermal nitridation process, the formation of the first nitridized dielectric surface layer 20 can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 450° C. In another embodiment, the plasma nitridation process employed in the present application is performed at a temperature from 100° C. to 300° C.

Notwithstanding the type of nitridation employed, the depth of the first nitridized dielectric surface layer 20 may vary. Typically, the depth of the first nitridized dielectric surface layer 20, as measured from the topmost exposed surface of the interconnect dielectric material layer 16 inward, is from 0.5 nm to 20 nm, with a depth from 1 nm to 10 nm being more typical.

The first nitridized dielectric surface layer 20 is composed of a same dielectric material as the interconnect dielectric material layer 16 with added nitrogen. In some embodiments, the first nitrogen content (which is a combination of added nitrogen plus any nitrogen that may be present in the interconnect dielectric material layer 16) of the first nitridized dielectric surface layer 20 is 10 atomic percent or greater. In one embodiment of the present application, the first nitrogen content of the first nitridized dielectric surface layer 20 can be from 10 atomic percent nitrogen to 50 atomic percent nitrogen. A nitrogen content of less than 10 atomic percent is also contemplated. The thickness of the first nitridized dielectric surface layer 20 is the same as the depth mentioned above. That is, the first nitridized dielectric surface layer 20 may, for example, have a thickness from 0.5 nm to 20 nm.

Figure 5:
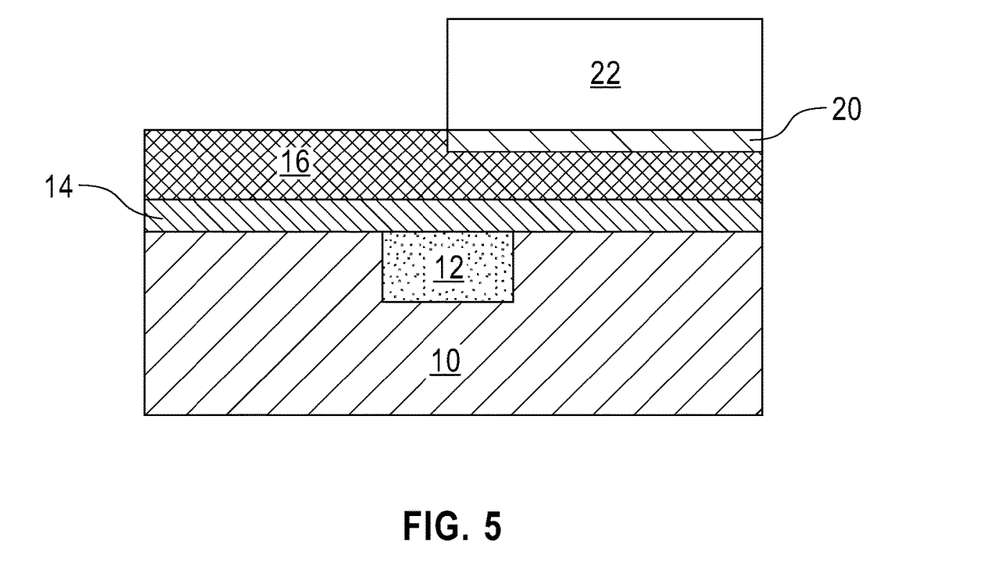
FIG. 5 is a cross sectional view of the exemplary semiconductor structure of FIG. 4 after removing the first block mask, and forming a second block mask on the first nitridized dielectric surface layer.

Referring now to FIG. 5, there is illustrated the exemplary semiconductor structure of FIG. 4 after removing the first block mask 18 and forming a second block mask 22 on the first nitridized dielectric surface layer 20. The first block mask 18 can be removed utilizing techniques well known in the art. For example, the first block mask 18 may be removed by ashing, planarization (such as, for example, chemical mechanical polishing) and/or etching.

The second block mask 22 is formed on the first nitridized dielectric surface layer 20, while leaving at least one portion of the interconnect dielectric material layer 16 exposed and available for further processing. In the present application, the second region of the dielectric-containing substrate (10, 14, 16) is left exposed, while the first region now containing the first nitridized dielectric surface layer 20 is protected by second block mask 22.

The second block mask 22 may include one of the block mask materials mentioned above for the first block mask 18. The second block mask 22 may be formed utilizing the technique(s) mentioned above in forming the first block mask 18. The second block mask 22 may have a thickness in the range mentioned above for the first block mask 18.

Figure 6:
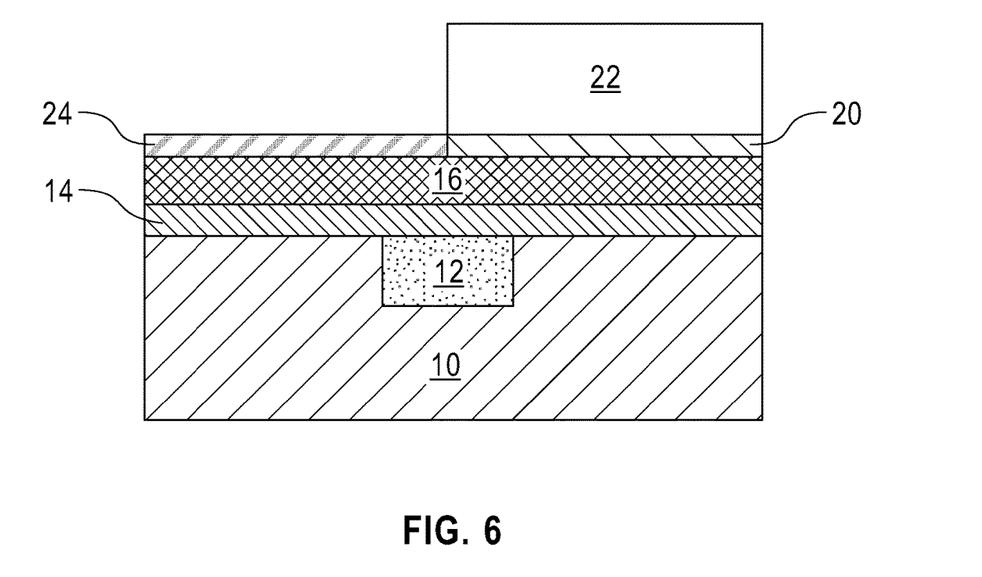
FIG. 6 is a cross sectional view of the exemplary semiconductor structure of FIG. 5 after performing a second nitridation process to provide a second nitridized dielectric surface layer having a second nitrogen content that differs from the first nitrogen content.

Referring now to FIG. 6, there is illustrated the exemplary semiconductor structure of FIG. 5 after performing a second nitridation process to provide a second nitridized dielectric surface layer 24 having a second nitrogen content that differs from the first nitrogen content; no nitridation occurs in the region of the dielectric-containing substrate that is protected by the second block mask 22. The second nitridized dielectric surface layer 24 is composed of a same dielectric material as the interconnect dielectric material layer 16 with added nitrogen.

In one embodiment of the present application, the second nitrogen content (which includes added nitrogen and any nitrogen present in the interconnect dielectric material layer 16) is greater than the first nitrogen content. In another embodiment, the second nitrogen content is less than the first nitrogen content. In one embodiment, the second nitrogen content is 10 atomic percent or greater. In one example of the present application, the second nitrogen content of the second nitridized dielectric surface layer 24 can be from 10 atomic percent nitrogen to 80 atomic percent nitrogen. A nitrogen content of less than 10 atomic percent is also contemplated. In the present application, at least one of the first and second nitrogen contents may be 10 atomic percent or greater. Typically, but not always, both the first and second nitrogen contents are 10 atomic percent or greater.

The second nitridation process may also be referred to herein as a second nitride surface treatment process. The second nitridized dielectric surface layer 24 may also be referred to herein as a second nitrogen enriched dielectric surface layer. The term "nitrogen enriched dielectric surface layer" has the same meaning as defined above.

In one embodiment, the second nitridation process used in forming the second nitridized dielectric surface layer 24 is a thermal nitridation process. The thermal nitridation process that may be employed as the second nitridation process is the same as defined above provided that the conditions are chosen to ensure that the content of nitrogen added to the second region differs from the content of nitrogen added in the first region. In one example, the nitrogen-containing ambient used in the first nitridation process comprises a different nitrogen content than the nitrogen-containing ambient used in the second nitridation process.

In another embodiment, the second nitridation process used in forming the second nitridized dielectric surface layer 24 is a plasma nitridation process. The plasma nitridation process that may be employed as the second nitridation process is the same as defined above provided that the conditions are chosen to ensure that the content of nitrogen added to the second region differs from the content of nitrogen added in the first region. In one example, the nitrogen-containing ambient used in the first nitridation process comprises a different nitrogen content than the nitrogen-containing ambient used in the second nitridation process.

Notwithstanding the type of nitridation employed, the depth of the second nitridized dielectric surface layer 24 may vary. Typically, the depth of the second nitridized dielectric surface layer 24, as measured from the topmost exposed surface of the interconnect dielectric material layer 16 inward, is from 0.5 nm to 20 nm, with a depth from 1 nm to 10 nm being more typical. As described above for the first nitridized dielectric surface layer 20, this depth also determines the thickness of the second nitridized dielectric surface layer 24.

In some embodiments, the second nitridized dielectric surface layer 24 has a bottommost surface that is coplanar with a bottommost surface of the first nitridized dielectric surface layer 20. In such an embodiment, the topmost surface of the second nitridized dielectric surface layer 24 is coplanar with a topmost surface of the first nitridized dielectric surface layer 20. In another embodiment, the second nitridized dielectric surface layer 24 has a bottommost surface that is not coplanar with a bottommost surface of the first nitridized dielectric surface layer 20. In such an embodiment, the topmost surface of the second nitridized dielectric surface layer 24 is however coplanar with a topmost surface of the first nitridized dielectric surface layer 20.

In either embodiment, a sidewall surface of the second nitridized dielectric surface layer 24 is in direct physical contact with a sidewall surface of the first nitridized dielectric surface layer 20. The second nitridized dielectric surface layer 24 is also composed of a same dielectric material as the interconnect dielectric material layer 16 with added nitrogen.

Figure 7:
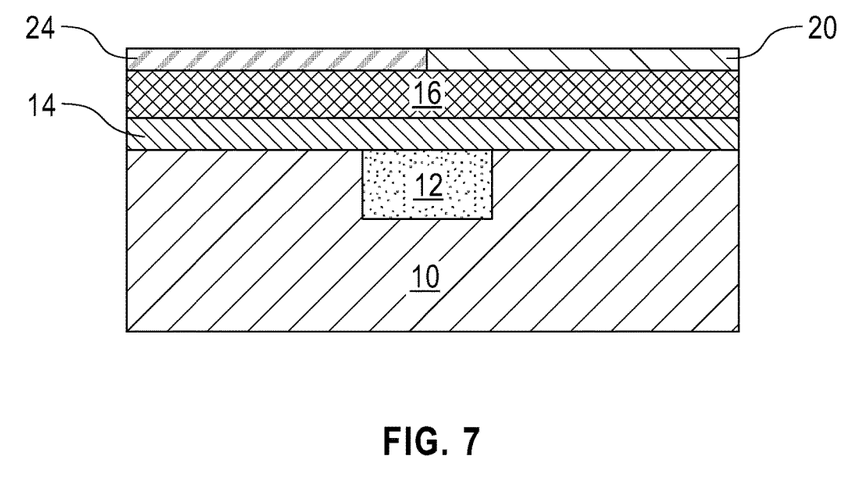
FIG. 7 is a cross sectional view of the exemplary semiconductor structure of FIG. 6 after removing the second block mask.

Referring now to FIG. 7, there is illustrated the exemplary semiconductor structure of FIG. 6 after removing the second block mask 22. The second block mask 22 may be removed utilizing one of the techniques mentioned above in removing the first block mask 18. In some embodiments (not shown), additional block mask formation and nitridation may be performed to provide further nitridized dielectric surface layers having other nitrogen contents within other portions of the interconnect dielectric material layer 16.

Figure 8:
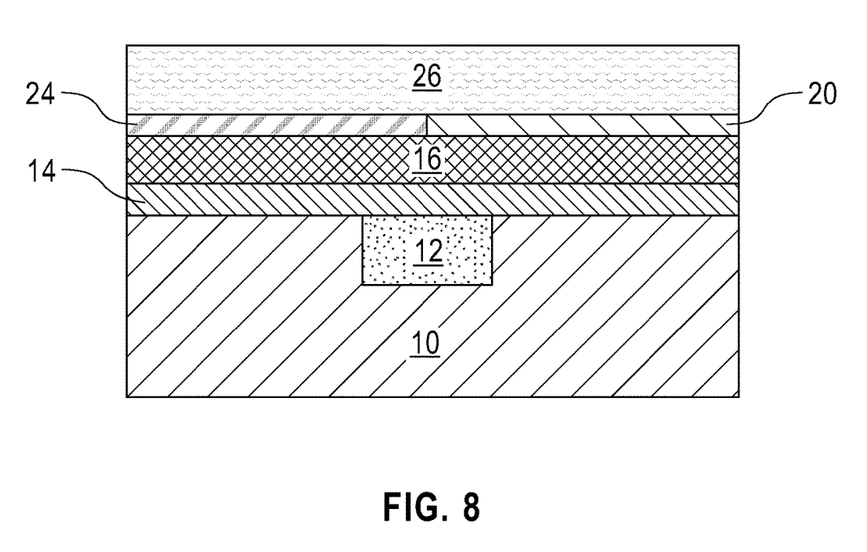
FIG. 8 is a cross sectional view of the exemplary semiconductor structure of FIG. 7 after forming a metal layer on both the first nitridized dielectric surface layer and the second nitridized dielectric surface layer.

Referring now to FIG. 8, there is illustrated the exemplary semiconductor structure of FIG. 7 after forming a metal layer 26 on both the first nitridized dielectric surface layer 20 and the second nitridized dielectric surface layer 24. The metal layer 26 that is formed in the present disclosure includes, but is not limited to, TaN, Ta, TiN, Ta, RuN, Ru, CoN, Co, WN, W, TaRuN and/or TaRu. In embodiments in which the metal layer 26 includes nitrogen, a nitrogen gradient may exist between the first metal layer 26 and the underlying first nitridized dielectric surface layer 20 and/or the second nitridized dielectric surface layer 24.

The metal layer 26 is a continuous layer that can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The metal layer 26 that is formed typically has a thickness from 2 nm to 50 nm, although other thicknesses are not excluded.

Figure 9:
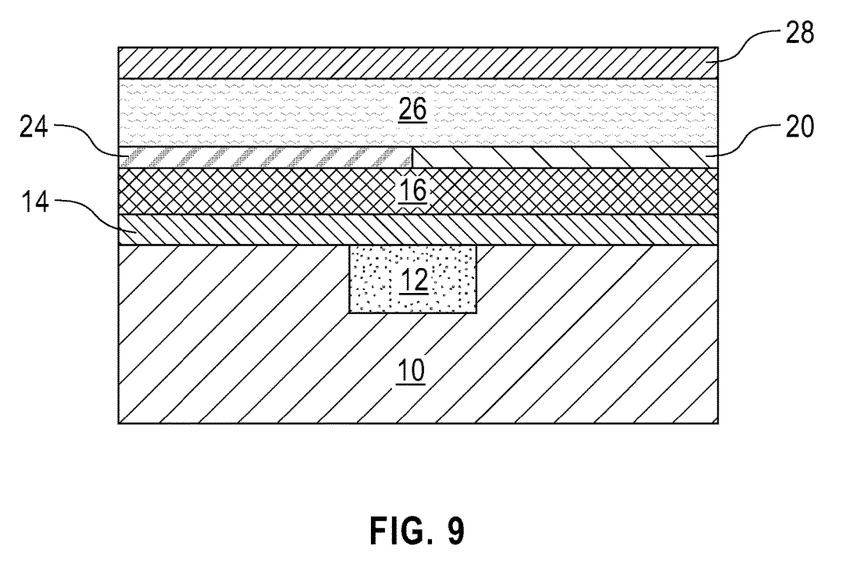
FIG. 9 is a cross sectional view of the exemplary semiconductor structure of FIG. 8 after forming a dielectric capping layer on the metal layer.

Referring now to FIG. 9, there is illustrated the exemplary semiconductor structure of FIG. 8 after forming a dielectric capping layer 28 on the metal layer 26. The dielectric capping layer 28 used may include one of the dielectric capping materials mentioned above for the base dielectric capping layer 14. The dielectric capping layer 28 may be formed utilizing one of the deposition processes mentioned above in forming the base dielectric capping layer 14. The dielectric capping layer 28 may have a thickness in the range mentioned above for the base dielectric capping layer 14.

Figure 10:
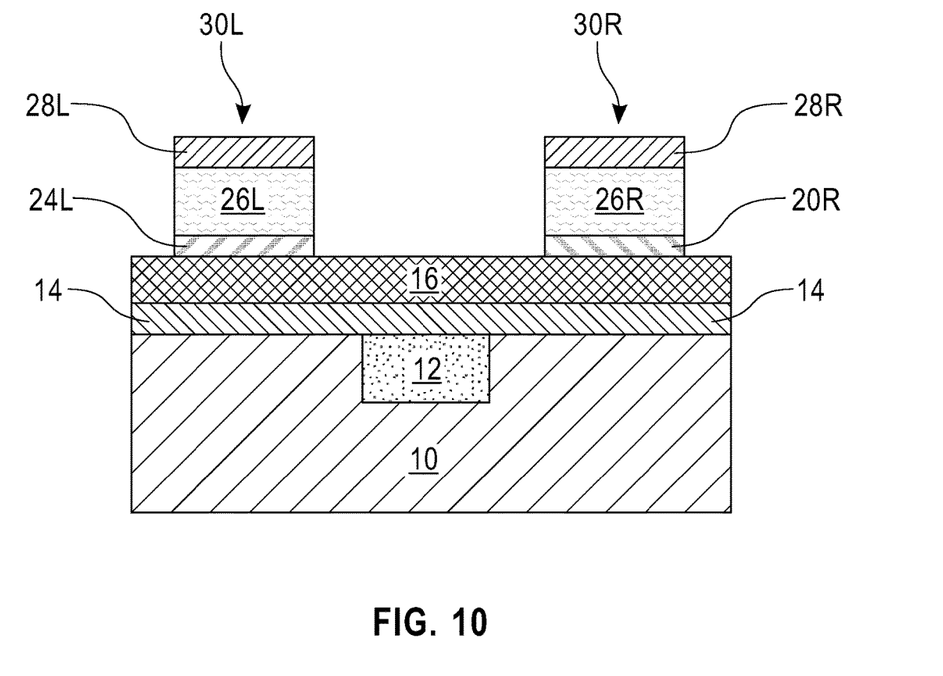
FIG. 10 is a cross sectional view of the exemplary semiconductor structure of FIG. 9 after performing a patterning process to provide a first metal resistor structure and a second metal resistor structure.

Referring now to FIG. 10, there is illustrated the exemplary semiconductor structure of FIG. 9 after performing a patterning process to provide a first metal resistor structure 30R and a second metal resistor structure 30L. The patterning process used to provide the first metal resistor structure 30R and the second metal resistor structure 30L may include lithography and etching as mentioned above. Other patterning processes such as, for example, a sidewall image transfer (SIT) or a direct self-assembly (DSA) patterning process.

As is shown, the first metal resistor structure 30R is spaced apart from the second metal resistor structure 30L. The first metal resistor structure 30R includes, from bottom to top, a remaining portion of the first nitridized dielectric surface layer 20 (hereinafter referred to as a first nitridized dielectric surface layer portion 20R), a first remaining portion of the metal layer 26 (hereinafter referred to as the first metal portion 26R), and a first remaining portion of the dielectric capping layer 28 (hereinafter referred to as a first dielectric capping layer portion 28R).

The second metal resistor structure 30L includes, from bottom to top, a remaining portion of the second nitridized dielectric surface layer 24 (hereinafter referred to as a second nitridized dielectric surface layer portion 24L), a second remaining portion of the metal layer 26 (hereinafter referred to as second metal portion 26L), and a second remaining portion of the dielectric capping layer 28 (hereinafter referred to as a second dielectric capping layer portion 28L).

As is shown, the various components (i.e., 20R, 26R, 28R) of the first metal resistor structure 30R have sidewall surfaces that are vertically aligned with each other. Also, the various components (i.e., 24L, 26L, 28L) of the second metal resistor structure 30L have sidewall surfaces that are vertically aligned with each other. In some embodiments of the present application and as shown, the corresponding components of the first and second metal resistor structures have bottommost surfaces that are coplanar with each other, and the corresponding components of the first and second metal resistor structures have topmost surfaces that are coplanar with each other. That is, the first nitridized dielectric surface layer portion 20R has a bottommost surface and a topmost surface that are coplanar with the bottommost and topmost surfaces, respectively of the second nitridized dielectric surface layer portion 24L, the first metal portion 26R has a bottommost surface and a topmost surface that are coplanar with the bottommost and topmost surfaces, respectively of the second metal portion 26L, and the first dielectric capping layer portion 28R has a bottommost surface and a topmost surface that are coplanar with the bottommost and topmost surfaces, respectively of the second dielectric capping layer portion 28L.

In accordance with an aspect of the present application and due to the presence of the first nitridized dielectric surface layer portion 20R and the second nitridized dielectric surface layer portion 24L, the first and second metal resistor structures have different resistivity and hence different resistance.

Figure 11:
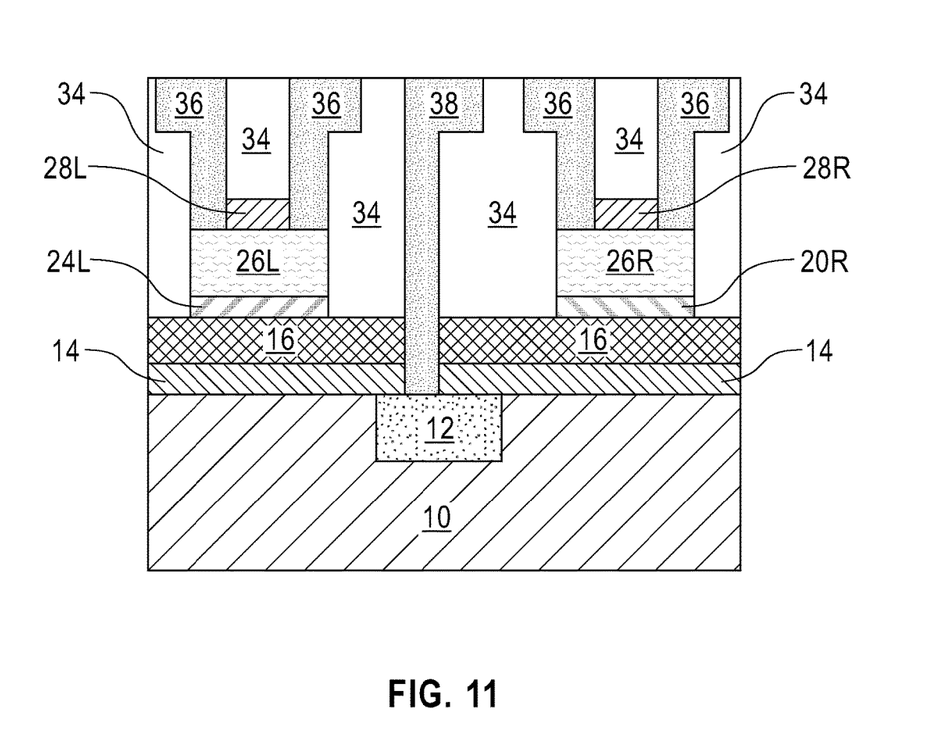
FIG. 11 is a cross sectional view of the exemplary semiconductor structure of FIG. 10 after forming a contact structure.

Referring now to FIG. 11, there is illustrated the exemplary semiconductor structure of FIG. 10 after forming a contact structure. Contact structure includes a dielectric material 34 that includes metal contact structures 36, 38 embedded therein. Metal contact structures 36 extend through the dielectric material 34 and contact a topmost surface each of the first metal portion 26R, and the second metal portion 26L. In some embodiments, the metal contact structures 36 are located at end portions of the first metal portion 26R and the second metal portion 26L. Metal contact structure 38 extends through the dielectric material 34 and contacts a topmost surface of one of the conductive regions 12 embedded in the base interconnect dielectric material 10.

The dielectric material 34 may be composed of one of the dielectric materials mentioned above for the base interconnect dielectric material layer 10. In one embodiment, the dielectric material 34 may be composed of a same dielectric material as the base interconnect dielectric material layer 10. In another embodiment, the dielectric material 34 may be composed of a different dielectric material than the base interconnect dielectric material layer 10. The dielectric material 34 can be formed utilizing one of the techniques mentioned above for the base interconnect dielectric material layer 10. The thickness of the dielectric material 34 can also be within the range mentioned above for the base interconnect dielectric material layer 10. Typically, the thickness of the dielectric material 34 is greater than the thickness of the base interconnect dielectric material layer 10.

The metal contact structures 36, 38 can include one of the conductive metals/metal alloys mentioned above for conductive regions 12. In one embodiment, the metal contact structures 36, 38 may be composed of a same conductive metal/metal alloy as the conductive metal/metal alloy that provides the conductive region 12. In another embodiment, the metal contact structures 36, 38 may comprise a different conductive material than the conductive material that provides the conductive regions 12. The metal contact structures 36, 38 can be formed utilizing the same technique as mentioned above for forming the conductive regions 12. That is, lithography, etching and filling openings with a conductive material can be employed. In some embodiments, a diffusion barrier and a plating seed layer can be formed prior to filling the openings with the conductive metal/metal alloy. Following the filling of the openings with at least the conductive material, a planarization process can be performed in order to form the structure illustrated in FIG. 11.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
    providing a dielectric-containing substrate comprising at least an interconnect dielectric material layer;
    performing a first nitridation process to provide a first nitridized dielectric surface layer having a first nitrogen content in a first region of the dielectric-containing substrate and within a portion of the interconnect dielectric material layer;
    performing a second nitridation process to provide a second nitridized dielectric surface layer having a second nitrogen content that differs from the first nitrogen content in a second region of the dielectric-containing substrate and within another portion of the interconnect dielectric material layer;
    forming a metal layer on the first nitridized dielectric surface layer and the second nitridized dielectric surface layer;
    forming a dielectric capping layer on the metal layer; and
    patterning the dielectric capping layer, the metal layer, the first nitridized dielectric surface layer and the second nitridized dielectric surface layer to provide a first metal resistor structure spaced apart from a second metal resistor structure.

2. The method of claim 1, wherein the first metal resistor structure comprises, from bottom to top, a remaining portion of the first nitridized dielectric surface layer, a first remaining portion of the metal layer, and a first remaining portion of the dielectric capping layer, and the second metal resistor structure comprises, from bottom to top, a remaining portion of the second nitridized dielectric surface layer, a second remaining portion of the metal layer, and a second remaining portion of the dielectric capping layer.

3. The method of claim 1, wherein the providing the dielectric-containing substrate comprises:
    forming a base dielectric capping layer on a surface of a base interconnect dielectric material layer, the base interconnect dielectric material layer containing at least one conductive region embedded therein; and
    forming the interconnect dielectric material layer on the base dielectric capping layer.

4. The method of claim 1, wherein at least one of the first nitridation process and the second nitridation process comprises a thermal nitridation process, wherein the thermal nitridation process is performed at a temperature from 50° C. to 450° C. in a nitrogen-containing ambient.

5. The method of claim 4, wherein the nitrogen-containing ambient used in the first nitridation process comprises a different nitrogen content than the nitrogen-containing ambient used in the second nitridation process.

6. The method of claim 4, wherein the thermal nitridation process employed uses an electrical bias less than 200 W.

7. The method of claim 1, wherein at least one of the first nitridation process and the second nitridation process comprises a plasma nitridation process, wherein the plasma nitridation process is performed at a temperature from 50° C. to 450° C. in a nitrogen-containing ambient.

8. The method of claim 7, wherein the nitrogen-containing ambient used in the first nitridation process comprises a different nitrogen content than the nitrogen-containing ambient used in the second nitridation process.

9. The method of claim 7, wherein the plasma nitridation process is employed using an electrical bias of greater than 200 W.

10. The method of claim 1, wherein at least one of the first nitrogen content and the second nitrogen content is 10 atomic percent or greater.

11. The method of claim 1, wherein the first metal resistor structure has a different resistivity than the second metal resistor structure.

12. The method of claim 1, further comprising:
    forming, prior to performing the first nitridation process, a first block mask over the second region;
    removing, after the performing the first nitridation process, the first block mask;
    forming, prior to the performing the second nitridation process, a second block mask on the first nitridized dielectric surface layer; and
    removing, after the performing the second nitridation process, the second block mask.

13. The method of claim 2, wherein sidewall surfaces of the first nitridized dielectric surface layer portion, the first remaining portion of the metal layer, and the first remaining portion of the dielectric capping layer are vertically aligned with each other, and wherein sidewall surfaces of the second nitridized dielectric surface layer portion, the second remaining portion of the metal layer, and the second remaining portion of the dielectric capping layer are vertically aligned with each other.

14. The method of claim 1, further comprising forming a contact structure surrounding the first and second metal resistor structures, wherein the contact structure includes metal contacts extending to a topmost surface of each of the first and second metal resistor structures.

15. The method of claim 1, wherein the metal layer comprises a metal or metal alloy selected from TaN, Ta, TiN, Ta, RuN, Ru, CoN, Co, WN, W, TaRuN and TaRu.

16. The method of claim 1, wherein the first metal resistor structure and the second metal resistor structure have a same height.

17. The method of claim 1, wherein the first metal resistor structure has a topmost surface that is coplanar with a topmost surface of the second metal resistor structure.

18. The method of claim 1, wherein each of the first and second nitridized dielectric surface layers has a depth, measured from a topmost surface of the interconnect dielectric material layer inward, from 0.5 nm to 20 nm.

19. The method of claim 1, wherein each of the first and second nitridized dielectric surface layers is composed of a same dielectric material as the interconnect dielectric material layer with added nitrogen.

20. The method of claim 1, wherein, prior to patterning, a sidewall surface of the first nitridized dielectric surface layer is in direct physical contact with a sidewall surface of the second nitridized dielectric surface layer.

* * * * *